United States Patent [19]

Scovell et al.

[11] Patent Number: 4,468,308

[45] Date of Patent: Aug. 28, 1984

[54] METALLIC SILICIDE PRODUCTION

[75] Inventors: Peter D. Scovell, Chelmsford; Paul J. Rosser; Gary J. Tomkins, both of Harlow, all of England

[73] Assignee: ITT Industries, Inc., New York, N.Y.

[21] Appl. No.: 463,375

[22] Filed: Feb. 3, 1983

[51] Int. Cl.³ .............................................. C23C 15/00
[52] U.S. Cl. .......................... 204/192 R; 204/192 SP; 204/192 C
[58] Field of Search .......... 204/192 R, 192 SP, 192 C

[56] References Cited

U.S. PATENT DOCUMENTS

| | | | |
|---|---|---|---|
| 3,661,760 | 5/1972 | Borgne | 204/192 R |
| 3,779,273 | 12/1973 | Panzera | 204/192 C |
| 3,912,461 | 10/1975 | Wakefield | 204/192 C |
| 3,927,225 | 12/1975 | Cordes et al. | 204/192 SP |
| 4,123,566 | 10/1978 | Chatterji | 204/192 C |
| 4,218,291 | 8/1980 | Fukuyama et al. | 204/192 C |
| 4,234,622 | 11/1980 | Dubuske et al. | 204/192 R |
| 4,281,030 | 7/1981 | Silfvast | 204/192 R |
| 4,322,453 | 3/1982 | Miller | 204/192 C |

OTHER PUBLICATIONS

Tsaur et al., App. Phys. Lett., 34(2), 1979.

Primary Examiner—Arthur P. Demers
Attorney, Agent, or Firm—James B. Raden

[57] ABSTRACT

A metallic silicide layer is formed on a substrate by pulse heating, in an inert atmosphere, metal and silicon deposited on the substrate to a temperature and for a time sufficient to cause interdiffusion of the metal and silicon.

10 Claims, 3 Drawing Figures

METALLIC SILICIDE PRODUCTION

This invention relates to metallic silicide production and, in particular, to the production of metallic silicide layers on substrates, such as semiconductor bodies, for electrical interconnection purposes.

BACKGROUND OF THE INVENTION

The reduction of semiconductor device geometries necessary for the realisation of very large scale integration (VLSI) circuits requires a reduction in the resistivity of the high-temperature-compatible interconnect materials employed, and to this end metallic silicides, such as titanium, tantalum, tungsten or molybdenum silicide, are increasingly being adopted as an alternative to polysilicon.

A general reduction of process temperatures or times is also desirable to minimise redistribution of dopants and interdiffusion of adjacent layers. Presently, for example, titanium and silicon layers are annealed for some 30 to 40 minutes in order to form titanium disilicide, and the length of such anneal times is disadvantageous. Whilst it has been shown that such anneal times can be reduced, this necessitates the acceptance of a reduction in the conductivity of the titanium disilicide films produced.

SUMMARY OF INVENTION

According to the present invention there is provided a method of forming a metallic silicide layer on a substrate, including the steps of depositing the metal and silicon on the substrate, and subsequently pulse heating the substrate, in an inert atmosphere, to a temperature and in a time sufficient to cause interdiffusion of the metal and silicon to form a homogenous layer and reaction of the constituents thereof to form the metallic silicide.

BRIEF DESCRIPTION OF THE DRAWINGS

Embodiments of the invention will now be described with reference to the accompanying drawings, in which.

DESCRIPTION OF THE PREFERRED EMBODIMENT

It has previously been shown that a short high temperature anneal at the end of a process is highly beneficial in terms of activating dopants (U.S. Pat. No. 4,350,537) or reactivating dopants (U.S. patent application Ser. No. 413,327, filed Aug. 31, 1982). We have now found that it is possible to achieve the desired high conductivity in titanium silicide films by using only very short high temperature anneal processes during their manufacture.

In one experiment for obtaining titanium disilicide films, an 80 nm thermal oxide layer was grown by a wet oxidation process on a silicon wafer in order to provide a suitable substrate which is comparable with a processed (diffused) wafer on which titanium disilicide interconnections would be provided. Titanium and silicon layers, which are 7 nm and 14 nm thick respectively, were alternatively sputtered onto the substrate until a total film thickness (titanium and silicon layers) of 200 nm was achieved on the oxide layer. The film had a metallic silver appearance and a sheet resistance of $25\Omega/\square$. A dc magnetron sputtering source was used for the titanium layers, whereas an rf magnetron sputtering source was used to provide the silicon layers, in view of the higher resistivity of the polycrystalline silicon target. Both of the titanium and silicon targets employed were specified pure to 99.99%. The sputtering was carried out in a chamber evacuated to $10^{-5}$ torr prior to back filling with argon to a pressure of $8\times10^{-3}$ torr. The thickness and composition of the film were calculated from deposition rates, which were checked by etching a step in the film and measuring its height, and also by measuring the weight increase after deposition.

Figure 1:
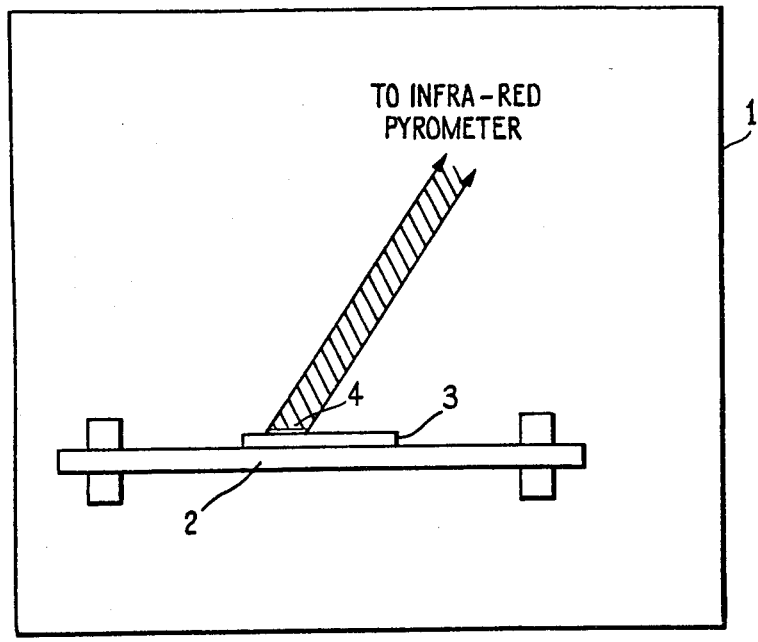
FIG. 1 shows, schematically, pulse anneal apparatus employed for titanium silicide layer production according to one embodiment of the present invention.

Prior to an annealing process, in which the film constituents interdiffuse to form an homogenous layer and then react to form the low resistivity disilicide, for experimental purposes the wafer was scribed into 1 centimeter squares and a drop of colloidal carbon solution was placed on each square in order to enable the actual wafer temperature to be monitored by a pyrometer during the anneal. The squares were then annealed in the pulse anneal apparatus shown schematically in FIG. 1.

Anneal chamber 1 includes a graphite heater 2 on which one or more coated squares 3, only one of which is shown, are arranged for heating purposes. The square 3 has a carbon coated surface portion 4 used for monitoring the temperature of the square by means of an infra-red pyrometer (not shown). The anneal chamber 1 is first evacuated to $5\times10^{-6}$ torr and then back filled with nitrogen to a pressure slightly above atmospheric. The square 3 was then heated by passing current through the graphite heater 2 and monitoring the temperatures achieved by means of the infra-red pyrometer. As in the case of the previously mentioned co-pending applications, the heating is pulse heating, that is rapidly raising the temperature to a peak value and then allowing it to cool, immediately in the case of "triangular" pulse heating. Depending on the square temperature required the current was passed through the graphite heater for a corresponding time, which varied from 8 seconds for 700° C. to 19 seconds for 1100° C. The thicker the individual layers, the longer the anneal necessary to interdiffuse the layers. The square 3 was left to cool in the chamber 1 for 10 to 15 minutes, taking under 30 seconds to cool below 600° C. All trace of the carbon coating 4 was removed and a four point probe used to measure the sheet resistance of the annealed film.

Figure 2:
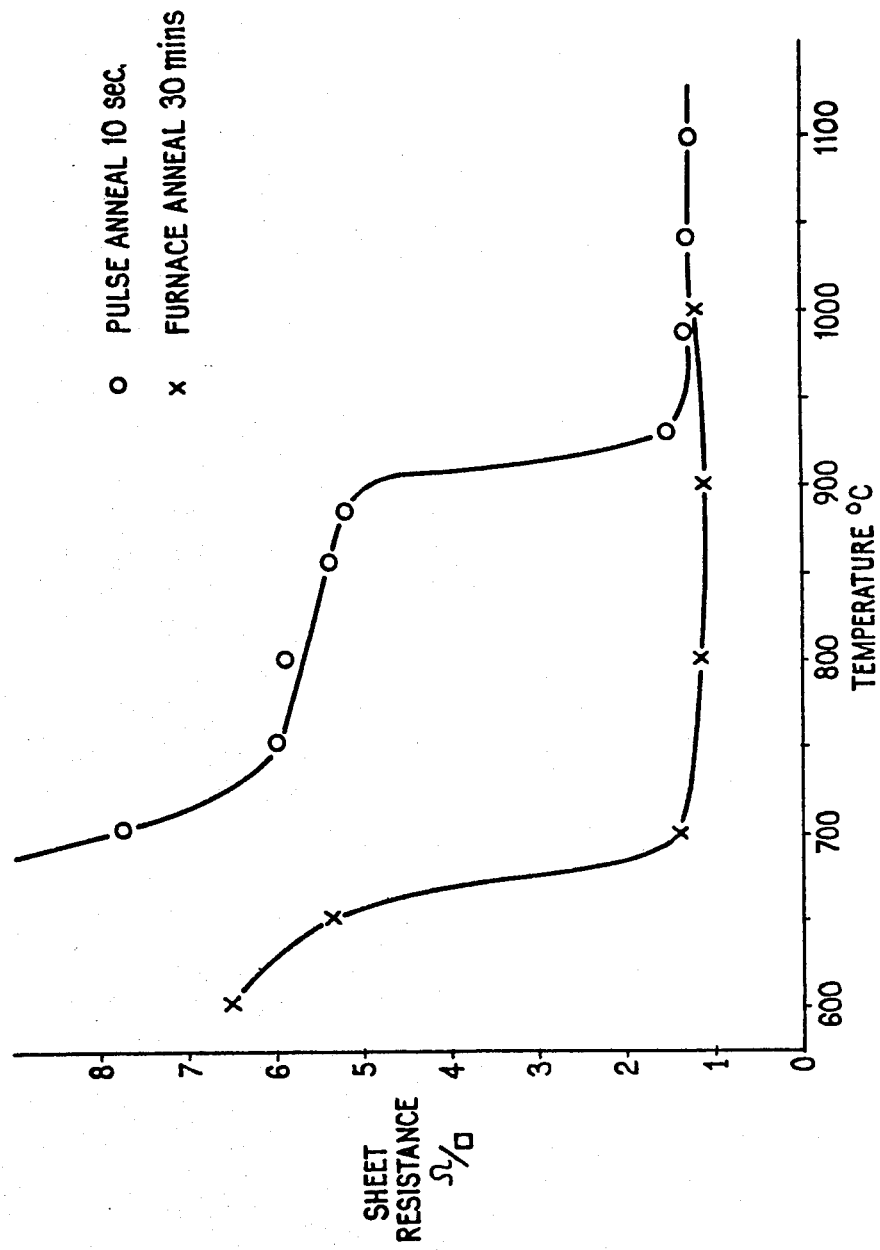
FIG. 2 shows plots of sheet resistance versus anneal temperature for the pulse anneal process of the present invention and a conventional furnace process.

FIG. 2 shows the relation between sheet resistance of annealed titanium/silicon films and the anneal temperature for the pulse heating process of the present invention and a conventional 30 minutes furnace anneal process. The pulse anneal curve shows that the sheet resistance can be reduced rapidly thereby from the as deposited value of $25\Omega/\square$ to $6\Omega/\square$ by employing 10 second pulse heating to temperatures of up to approximately 900° C., the heater current being suitably varied to achieve the required temperature in 10 seconds, however temperatures in excess of 900° C. are required for further drop in the sheet resistance to approximately $1\Omega/\square$.

As previously mentioned the completion of two processes is required to achieve low resistivity films when the film constituents are sputtered alternately. The film constituents must first interdiffuse to form an homogenous layer, and they must then react in order to form the silicide. It is considered likely that sufficient interdiffusion to form titanium monosilicide occurs very rapidly at temperatures above 750° C., but that temperatures in excess of 900° C. are required, given the short length of the heating pulse, to form the lower resistivity titanium disilicide throughout the film. The sheet resistivity of the films pulse annealed above 900° C. is directly comparable with that obtained from films annealed in a conventional furnace for 30 minutes, as can be ascertained from the furnace anneal plot in FIG. 2, indicating that the interdifusion and reaction of titanium and silicon are complete.

The post pulse anneal film thickness for the 1100° C. sample was estimated by Auger profiling to be 175 nm. This and the measured sheet resistance of 1.3Ω/□ show that the bulk resistivity of the annealed film is close to 23 $\mu\Omega$cm, which is in good agreement with previously reported values for titanium disilicide.

Figure 3:
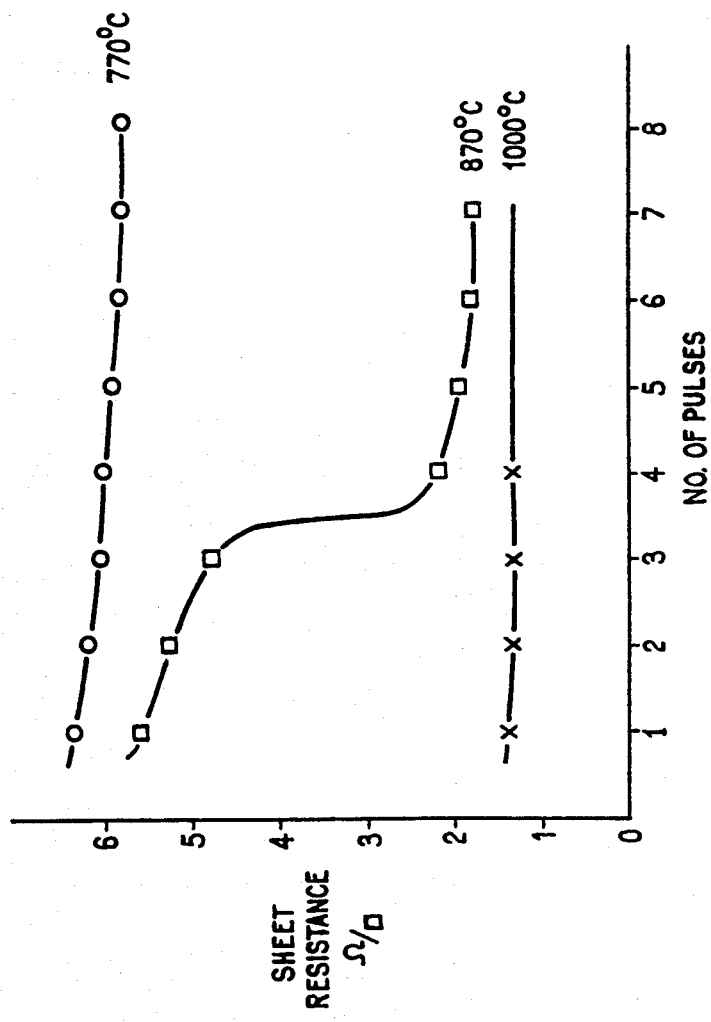
FIG. 3 shows plots of sheet resistance versus the number of heat pulses employed for different anneal temperatures.

FIG. 3 shows the sheet resistivity after repeated pulses, and indicates the effectiveness of pulse annealing compared with a full furnace anneal. As mentioned above, for pulse anneals at temperatures in excess of 900° C. the interaction appears to be complete, with subsequent pulses yielding no further improvement. The sample pulse annealed at 870° C., however, shows a dramatic drop in sheet resistance after only a few (three) pulses, whereas the sample pulse annealed at 770° C. does not show a similar change after more than twice as many (eight) pulses.

It is presently considered that by decreasing the thickness of the individual titanium and silicon layers, the peak temperature of the pulse anneal required to obtain high conductivity (low resistivity) will drop. The 770° C. plot of FIG. 3 could then be expected to approximate more to the 870° C. plot, or even the 1000° C. plot. The limiting temperature is approximately 600° C., which is the lowest temperature at which titanium disilicide is the favoured phase for formation. Even with the anneal pulse at approximately 950° C., the equilibrium diffusion of dopants is predicted to be negligible, by analogy with the dopant activation and reactivation effect of pulse heating referred to in the above co-pending applications, and in fact the short high temperature anneal used to activate or reactivate dopants at the end of a process could also be used to anneal titanium silicide gate electrodes and interconnects. The pulse heating (annealing) of the present invention for silicide production avoids the problem of over-diffusing other dopants in the semiconductors.

Whereas the invention has been described with reference to providing titanium silicide layers on semiconductor substrates, it can also be applied to other substrates. Metallic silicides other than titanium silicide may be produced in a similar manner, such as tantalum, tungsten or molybdenum silicide.

The method described above employs sputtering of the metal and silicon alternately onto a substrate. Alternatively, however, the metal and silicon may be simultaneously co-sputtered, whereby to achieve an almost homogenous film, in which case the pulse heating mainly serves for causing the necessary reaction between the metal and the silicon to form the silicide.

The above described metal silicide production may be employed in the manufacture of, for example, n-channel MOS integrated circuits, the basic processing steps of which are as follows, namely: (1) define device area for local oxidation; (2) implant field; (3) grow field oxide; (4) grow gate oxide and implant gate region; (5) deposit titanium silicide and define; (6) implant source and drain; (7) pulse anneal titanium silicide and source/drain; (8) grow or deposit intermediate oxide and define contacts; (9) reactivation pulse anneal; (10) metal deposition and definition, and (11) passivation and packaging.

What is claimed is:

1. A method of forming a metallic silicide layer on a substrate, including the steps of depositing the metal and silicon on the substrate, and subsequently pulse heating the substrate, in an inert atmosphere, to a temperature and in a time sufficient to cause interdiffusion of the metal and silicon to form a homogenous layer and reaction of the constituents thereof to form the metallic silicide.

2. A method as claimed in claim 1, wherein the step of depositing the metal and silicon comprises depositing alternate layers of the metal and silicon on the substrate.

3. A method as claimed in claim 1, wherein the step of depositing the metal and silicon comprises co-sputtering the metal and silicon on the substrate.

4. A method as claimed in any one of the preceding claims wherein the metal is titanium.

5. A method as claimed in claim 2, wherein the metal is titanium, and wherein the substrate is pulse heated to a temperature greater than 900° C. within a time of the order of 10 seconds, whereby to form titanium silicide throughout the homogenous layer.

6. A method as claimed in claim 2, wherein the metal is titanium, and wherein the substrate is successively pulse heated a plurality of times to a temperature greater than 600° C. but less than 900° C., whereby to form titanium silicide.

7. A method as claimed in claim 1, wherein the substrate is a semiconductor body and wherein the metallic silide provides electrodes for or interconnections between doped regions in the semiconductor body.

8. A method as claimed in claim 7, wherein the pulse heating to form the metallic silicide serves also to activate or reactivate dopants in the semiconductor body.

9. A method as claimed in claim 7 or 8, wherein the semiconductor is silicon.

10. A method as claimed in claim 1, wherein the inert atmosphere comprises nitrogen.

* * * * *